United States Patent
Nguyen et al.

[11] Patent Number: 5,973,967
[45] Date of Patent: Oct. 26, 1999

[54] PAGE BUFFER HAVING NEGATIVE VOLTAGE LEVEL SHIFTER

[75] Inventors: Chinh D. Nguyen, San Jose; Andy Teng-Feng Yu, Palo Alto; Vikram Kowshik, San Jose; Vishal Sarin, Santa Clara, all of Calif.

[73] Assignee: Programmable Microelectronics Corporation, San Jose, Calif.

[21] Appl. No.: 08/985,561

[22] Filed: Dec. 5, 1997

Related U.S. Application Data

[63] Continuation-in-part of application No. 08/778,802, Jan. 3, 1997, Pat. No. 5,696,728.

[51] Int. Cl.⁶ .............................. G11C 16/04; G11C 11/00
[52] U.S. Cl. ................ 365/189.05; 365/154; 365/185.12
[58] Field of Search ................................ 365/189.05, 154, 365/156, 185.01, 185.07, 185.13, 185.18, 185.26, 185.28, 185.29, 185.33, 218, 185.12; 257/315, 316

[56] References Cited

U.S. PATENT DOCUMENTS

| | | | |
|---|---|---|---|
| 5,475,634 | 12/1995 | Wang et al. | 365/189.05 |
| 5,625,544 | 4/1997 | Kowshik et al. | 327/536 |
| 5,638,326 | 6/1997 | Hollmer et al. | 365/189.05 |
| 5,687,118 | 11/1997 | Chang | 257/315 |
| 5,691,939 | 11/1997 | Chang et al. | 257/316 |
| 5,692,138 | 11/1997 | Fandrich et al. | 365/189.05 |
| 5,696,728 | 12/1997 | Yu et al. | 365/218 |
| 5,706,227 | 1/1998 | Chang et al. | 365/185.18 |
| 5,724,284 | 3/1998 | Bill et al. | 365/189.05 |
| 5,761,132 | 6/1998 | Kim | 365/189.05 |
| 5,768,215 | 6/1998 | Kwon et al. | 365/189.05 |
| 5,801,994 | 9/1998 | Chang et al. | 365/185.29 |

*Primary Examiner*—David Nelms
*Assistant Examiner*—Trong Phan
*Attorney, Agent, or Firm*—Flehr Hohbach Test Albritton & Herbert LLP

[57] ABSTRACT

A page buffer facilitates programming of a memory cell within an associated memory array by selectively connecting a bit line associated with the memory cell to a negative voltage supply in response to the logic state of a data signal. The page buffer includes an SRAM latch having first and second nodes, a cross-coupled latch having first and second nodes, and a pass transistor. The first node of the SRAM latch is coupled to receive the data signal and to a first control terminal of the cross-coupled latch. The second node of the SRAM latch is coupled to a second control terminal of the cross-coupled latch. The second node of the cross-coupled latch is coupled to a gate of the pass transistor which, in turn, is connected between the bit line and the negative voltage supply. When the data signal is in a first logic state, the cross-coupled latch turns on the pass transistor and, in connecting the bit line to the negative voltage supply, facilitates programming of the cell. When the data signal is in a second logic state, the cross-coupled latch turns off the pass transistor and allows the bit line to float which, in turn, precludes programming of the cell.

10 Claims, 2 Drawing Sheets

PAGE BUFFER HAVING NEGATIVE VOLTAGE LEVEL SHIFTER

CROSS-REFERENCE TO RELATED APPLICATIONS

This application is a continuation-in-part application of the commonly owned and co-pending U.S. patent application Ser. No. 08/778,802 entitled "Negative Voltage Level Shift Circuit" and filed Jan. 3, 1997, which is U.S. Pat. No. 5,696,728.

BACKGROUND

1. Field of Invention

This invention relates generally to semiconductor memories and specifically to a page buffer having a negative level shift circuit.

2. Description of Related Art

Typically, nonvolatile semiconductor memories such as, for instance, EEPROM and Flash EEPROM, employ a plurality of NMOS floating gate transistors as memory cells. However, recent advances in the semiconductor industry have led to the development of a PMOS non-volatile memory cell. Examples of PMOS memory cells and the advantages thereof are described in commonly owned U.S. Pat. Nos. 5,666,307 and 5,687,118, and in co-pending U.S. Pat. No. 5,706,227 entitled "Triple Poly PMOS Flash Memory Cell" and filed on Dec. 7, 1995, and Ser. No. 08/568,544 entitled Double Poly Split Gate PMOS Flash Memory Cell" and filed Dec. 7, 1995, which is U.S. Pat. No. 5,706,227 all incorporated herein by reference.

A PMOS memory cell of the type disclosed in U.S. Pat. No. 5,687,118 is shown in FIG. 1. The cell 10 is formed in an n– well region 12 of a p– substrate 14. A p+ source 16 and a p+ drain 18 are formed in the n– well region 12. A channel region 20 extends within the n– well 12 between the p+ source 16 and the p+ drain 18. A polysilicon floating gate 22 is insulated from the n– well region 12 by a thin oxide layer 24. A control gate 26 is insulated from the floating gate 22 by an insulating layer 28. In its intrinsic or erased state, the cell 10 has a negative threshold voltage ($V_T$).

The cell 10 is programmed by inducing the accumulation of charge, i.e., electrons, on the floating gate 22. The cell 10 may be programmed using a variety of mechanisms, including channel hot electron (CHE) injection, Fowler-Nordheim (FN) Tunneling, band-to-band tunneling (BTBT) induced electron injection, and various combinations thereof. When programmed, the cell 10 has a positive $V_T$. It is the difference between the program $V_T$ and the erase $V_T$ of a cell 10 which determines the "binary state" thereof. For instance, a programmed cell 10 represents the binary value "1", and an erased cell 10 represents the binary value binary "0". To read the binary state of a cell 10, a read voltage which lies between the program $V_T$ and the erase $V_T$ is applied to the control gate 26 of the cell 10. Thus, during a read operation the cell 10 conducts a channel current if in a programmed state, i.e., if its $V_T$ is positive.

The cells 10 may be included within a variety of array architectures such as, for instance, those described in the commonly owned U.S. Pat. No. 5,801,994 entitled "Nonvolatile Memory Array Architecture" and filed Aug. 15, 1997, Ser. No. 08/948,531 entitled "PMOS Memory Array Having OR Gate Architecture" and filed Oct. 9, 1997, and Ser. No. 08/947,850 entitled "Nonvolatile PMOS Two Transistor Memory Cell and Array" and filed Oct. 9, 1997, all incorporated herein by reference. In such array architectures, the control gates 26 of cells 10 in a common row are connected to an associated word line, and the p+ drains 18 of cells 10 in a common column are connected to an associated bit line. In some of these array architectures, the cells 10 are formed in a common n-well region which, in turn, is electrically coupled to the p+ sources of the cells 10.

Proper operation of PMOS memory cells such as the cell 10 shown in FIG. 1 requires bias voltages different from those in operation of NMOS memory cells. As a result, the peripheral circuitry (e.g., page buffers, charge pumps, row decoders, and so on) typically employed in an NMOS non-volatile memory are not suitable for use in a PMOS non-volatile memory. Rather, optimum performance of a PMOS nonvolatile memory requires unique peripheral circuitry. For instance, to facilitate programming of the cell 10 using BTBT induced electron injection, approximately 3 volts is applied to the N-well 12 and the p+ source 16, approximately 8.5 volts is applied to the control gate 26 via the selected word line, and approximately –5.5 volts is applied to the p+ drain 18 via the selected bit line.

NMOS memory cells, on the other hand, typically do not require negative voltages during programming. Thus, page buffers typically employed in an NMOS non-volatile memory are not designed to handle negative voltages and, as a result, are not suitable for use with negative voltages. For instance, application of such negative voltages to page buffers typically employed with NMOS memory cells may result in the transistor breakdown. Thus, a page buffer suitable for handling negative voltages during program operations of a PMOS memory cell is, therefore, desirable.

SUMMARY

In accordance with the present invention, a page buffer facilitates programming of a memory cell within an associated memory array by selectively connecting a bit line associated with the memory cell to a negative voltage supply in response to the logic state of a data signal. The page buffer includes an SRAM latch having first and second nodes, a cross-coupled latch having first and second nodes, and a pass transistor. The first node of the SRAM latch is coupled to receive the data signal and to a first control terminal of the cross-coupled latch. The second node of the SRAM latch is coupled to a second control terminal of the cross-coupled latch. The second node of the cross-coupled latch is coupled to a gate of the pass transistor which, in turn, is connected between the bit line and the negative voltage supply. When the data signal is in a first logic state, the cross-coupled latch turns on the pass transistor and, in connecting the bit line to the negative voltage supply, facilitates programming of the cell. When the data signal is in a second logic state, the cross-coupled latch turns off the pass transistor and allows the bit line to float which, in turn, precludes programming of the cell.

Like components in the Figures are similarly labeled.

DETAILED DESCRIPTION

Figure 1:
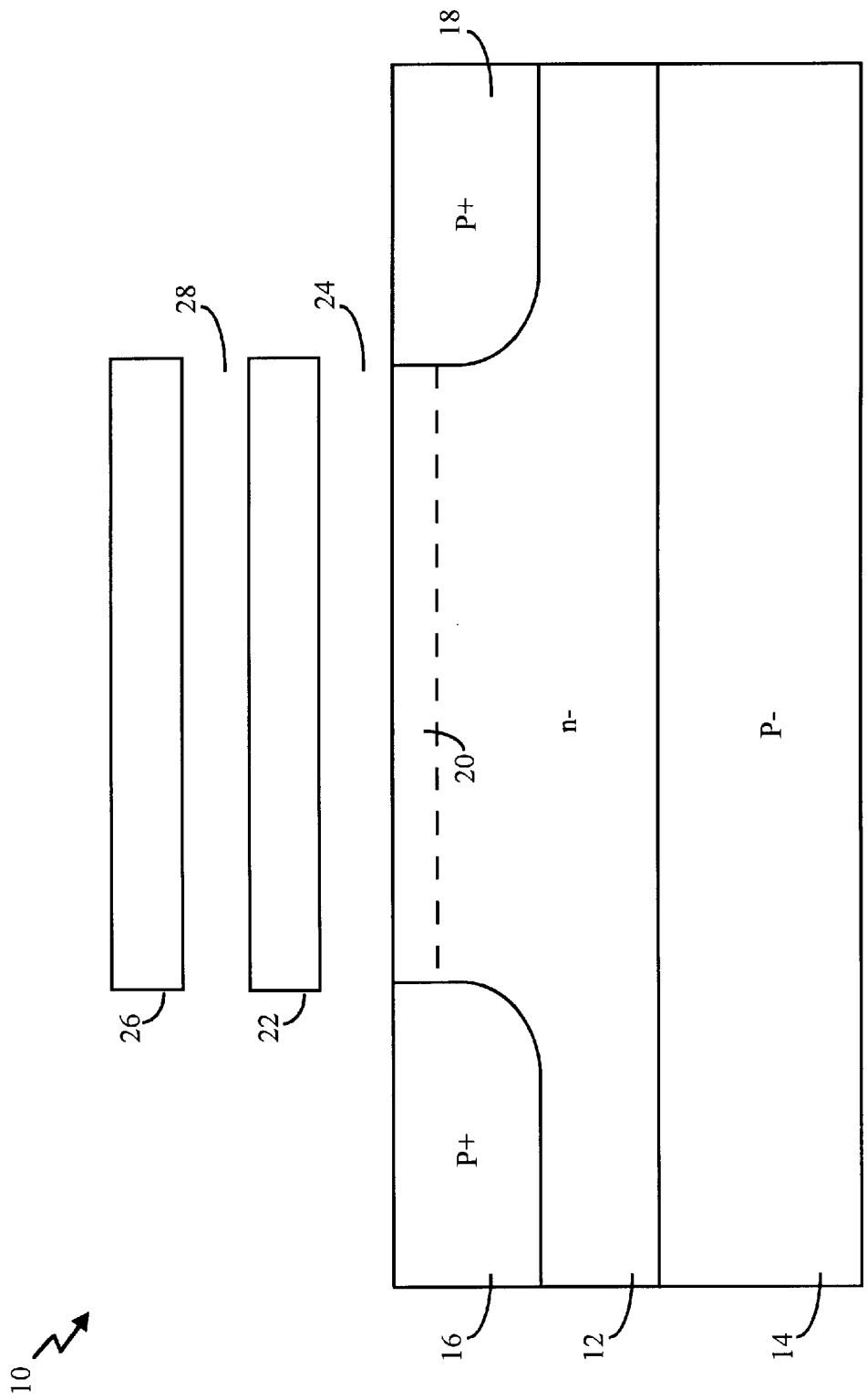
FIG. 1 is a cross-sectional view of a PMOS floating gate memory cell.
Figure 2:
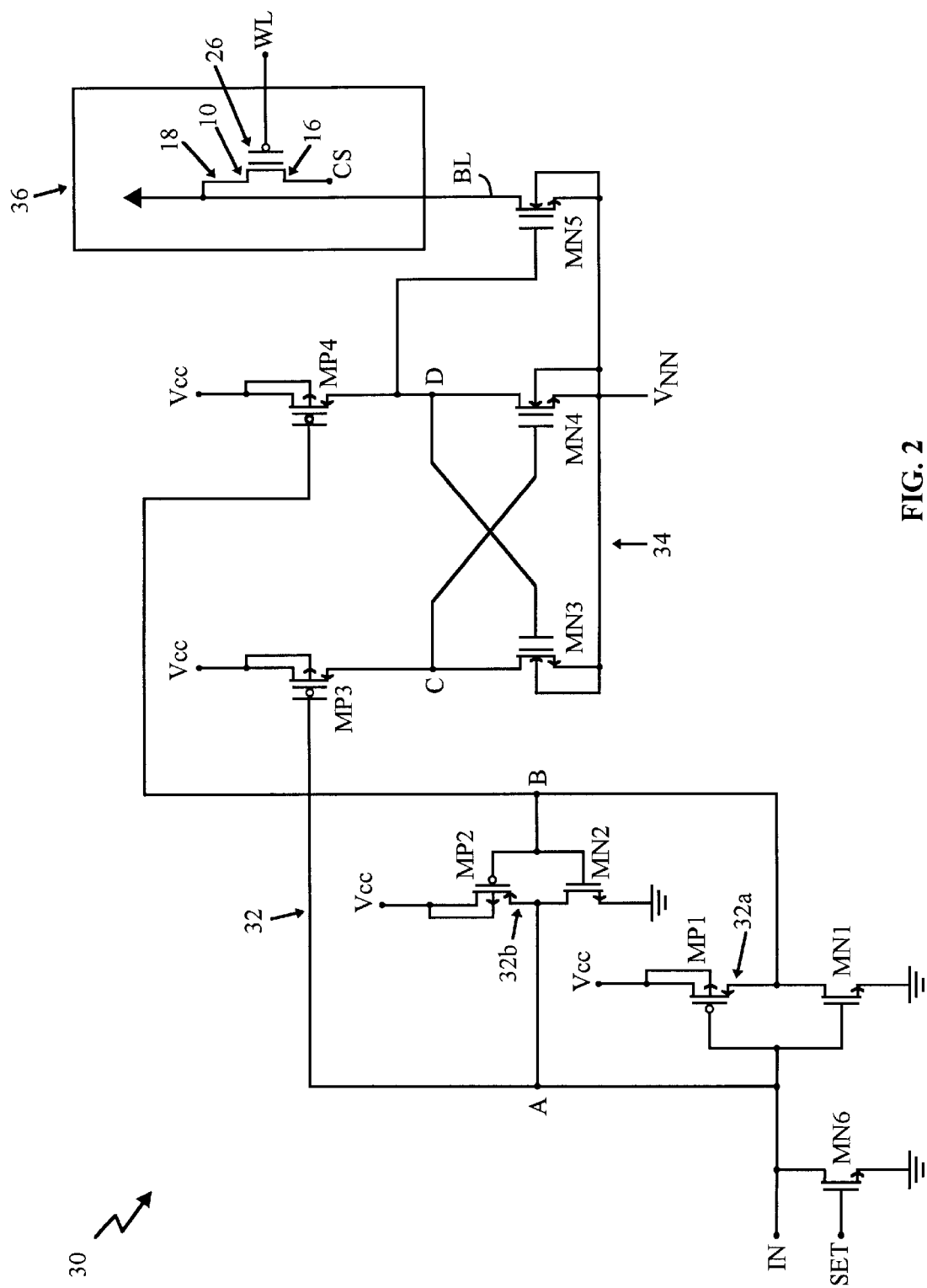
FIG. 2 is a schematic diagram of a page buffer in accordance with the present invention.

Present embodiments are discussed below in the context of programming the PMOS memory cell 10 of FIG. 1 for simplicity only. It is to be understood that present embodiments may be employed in memories having other suitable memory cells. Referring now to FIG. 2, the page buffer 30 includes an SRAM latch 32 and a cross-coupled latch 34. The SRAM latch 32 is formed by two CMOS inverters 32a and 32b, where the first CMOS inverter 32a includes a PMOS transistor MP1 and an NMOS transistor MN1 connected between a supply voltage $V_{CC}$ and ground potential, and the second CMOS inverter includes a PMOS transistor MP2 and an NMOS transistor MN2 connected between the supply voltage $V_{CC}$ and ground potential. The common drain of transistors MP2 and MN2 is coupled to the common gate of transistors MP1 and MN1 at node A, while the common drain of transistors MP1 and MN1 is coupled to the common gate of transistors MP2 and MN2 at node B. As shown in FIG. 2, node A of the SRAM latch 32 is coupled to an input terminal IN of the page buffer 30.

The cross-coupled latch 34 includes complementary nodes C and D and is formed by two PMOS transistors MP3 and MP4 and two NMOS transistors MN3 and MN4. Transistor MP3 is connected between $V_{CC}$ and node C and has a gate coupled to node A of the SRAM latch 32. Transistor MP4 is connected between $V_{CC}$ and node D and has a gate coupled to node B of the SRAM latch 32 and, thus, to the input terminal IN. Transistor MN3 is connected between node C and a negative voltage supply $V_{NN}$ and has a gate coupled to node D. Transistor MN4 is connected between node D and V, and has gate coupled to node C. An NMOS pass transistor MN5 coupled between $V_{NN}$ and a bit line BL and has a gate coupled to node D. The bit line BL is coupled to the p+ drain 18 of cell 10 in an associated memory array 36. The control gate 26 of cell 10 is coupled to a word line WL, and the p+ drain 18 of cell 10 is coupled to the bit line BL. The p+ source 16 of cell 10 is coupled to a common source node CS. Note that although not shown in FIG. 2, the memory array 36 would, in actual embodiments, include hundreds or even thousands of bit lines BL and word lines WL. In preferred embodiments, a second NMOS pass transistor MN6 is coupled between the input terminal IN and ground potential and has a gate coupled to receive a control signal SET.

Operation of the page buffer 30 is discussed below with respect to a program operation of cell 10 within the memory array 36, where $V_{CC}$ is approximately 3 volts and $V_{NN}$ is approximately −5.5 volts. The negative voltage of $V_{NN}$ may be generated by a suitable charge pump such as, for instance, that disclosed in the commonly owned U.S. Pat. No. 5,625,544.

Programming cell 10 may be facilitated by driving its word line WL to a positive voltage such as, for instance, 8.5 volts, holding its n-well region and the common source CS at a less positive voltage such as, for instance, 3 volts, and pulling its bit line BL to $V_{NN}$, i.e., to −5.5 volts. Programming of cell 10 may be precluded by holding the bit line BL at a floating potential. The page buffer 30 controls the voltage of the bit line BL in response to the binary state of a data signal received at an input/output (I/O) pin associated with the memory array 36 (the I/O pin is not shown for simplicity). In preferred embodiments, this data signal is inverted using a suitable buffer circuit and then provided to the input terminal IN of the page buffer 30. During program operations of the memory array 36, the control signal SET is at a logic low level, e.g., ground potential, to maintain the pass transistor MN6 in a nonconductive state.

For instance, to facilitate programming of cell 10, the input terminal IN is driven to a logic high level, e.g., $V_{CC}$ (node A is therefore at $V_{CC}$). In response thereto, the first CMOS inverter 32a pulls node B low to ground potential.

The second CMOS inverter 32b ensures that nodes A and B are maintained at complementary logic levels. Since node B is low, transistor MP4 turns on and pulls node D high to $V_{CC}$ which, in turn, turns on transistors MN3 and MN5. Transistor MN5 pulls the bit line BL to the negative voltage of $V_{NN}$, e.g., to about −5.5 volts. With the bit line BL at about −5.5 volts, programming of cell is facilitated as described above. That is, with the word line at approximately 8.5 volts and the common source CS and n-well region of cell 10 at about 3 volts, the floating gate 22 of cell 10 is charged via BTBT induced hot electron injection. Since node A is high, e.g., at $V_{CC}$, transistor MP3 is maintained in a non-conductive state and thereby isolates node C from $V_{CC}$. Further, with transistor MN3 turned on, node C is pulled to $V_{NN}$ which, in turn, maintains transistor MN4 in a non-conductive state and, thus, isolates node D from $V_{NN}$.

Where, on the other hand, it is desired to maintain cell 10 in an erased state, a logic low signal is provided to the input terminal IN. In response thereto, the first CMOS inverter 32a pulls node B high to $V_{CC}$ so as to maintain transistor MP4 in a non-conductive state, thereby isolating node D from $V_{CC}$. The second CMOS inverter 32b, in response to the logic high level at node B, pulls node A low to ground potential, thereby ensuring that nodes A and B of the SRAM latch are maintained at complementary logic levels. As a result, transistor MP3 turns on and pulls node C high to $V_{CC}$. With its gate at $V_{CC}$, transistor MN4 turns on and pulls node D to $V_{NN}$, e.g., to −5.5 volts, and thereby maintains transistors MN3 and MN5 in a non-conductive state. Here, transistor MN3 isolates node C from $V_{NN}$, and transistor MN5 isolates the bit line BL from $V_{NN}$. As a result, the bit line BL is at a floating potential and, as discussed above, thereby precludes programming of cell 10.

Thus, in preferred embodiments where, as discussed above, the logical complement of a data signal (received at an I/O pin associated with the memory array 36) is provided to the input terminal IN of the page buffer 30, cell 10 is programmed if the data signal is a binary "0" data signal and remains in an erased state if the data signal is a binary "1". Accordingly, cell 10 represents a "0" when in a programmed state and represents a "1" when in an erased state.

After the above-described program operation of the memory array 36 is complete, $V_{NN}$ is switched to ground potential. The page buffer 30 is then reset by asserting the control signal SET to a logic high level, e.g., $V_{CC}$. In response thereto, transistor MN6 turns on and pulls the input terminal IN low to ground potential which, as discussed above, forces node B high to $V_{CC}$. Thus, transistor MP4 is maintained in a nonconductive state and thereby isolates node D from $V_{CC}$. With node A at ground potential, transistor MP3 turns on and pulls node C high to $V_{CC}$. Thus, transistor MN4 turns on and pulls node D low to ground potential ($V_{NN}$). Thus, transistors MN3 and MN5 are maintained in non-conductive states. Here, transistor MN3 isolates node C from ground potential ($V_{NN}$), and transistor MN5 isolates the bit line BL from ground potential ($V_{NN}$). Thus, when the page buffer 30 is reset, nodes C and D are at $V_{CC}$ and ground potential, respectively.

In preferred embodiments, the second CMOS inverter 32b is much weaker than the first CMOS inverter 32a so that logic signals received at the input terminal IN are able to change the binary value stored in the SRAM latch 32, e.g., so that the logic level at node A follows the logic level of the signal provided to the input terminal IN. Further, NMOS transistors MN3 and MN4 within the cross-coupled latch 34 are relatively weak so that in actual embodiments, where hundreds or thousands of page buffers 30 are coupled to corresponding bit lines of an associated memory array, the charge pump (not shown for simplicity) which maintains $V_{NN}$ is able to charge all of the selected bit lines BL. Otherwise, where transistors MN3 and MN4 sink too much current from $V_{NN}$, the charge pump associated with $V_{NN}$ may not be able to charge the selected bit lines BL to a sufficiently negative voltage so as to facilitate programming of the selected cells 10.

For instance, in one embodiment, transistors MP1 and MN1 each have a channel width of 2 microns and a channel length of 0.6 microns, while transistors MP2 and MN2 have a channel width of 2 microns and a channel length of 4 microns. This gives the PMOS and NMOS transistors MN1, MP2 a larger current carrying capacity than the PMOS and NMOS transistors MN2, MP2. This scaling gives the first CMOS inverter 32a a trip point of about 1 volt and the second CMOS inverter 32b a trip point of about 1.5 volts. Transistors MP3 and MP4 have a channel width of 10 microns and a channel length of 2 microns, while transistors MN3 and MN4 have a channel width of 2 microns and a channel length of 10 microns. This gives the transistors MP3 and MP4 a larger current carrying capacity than the transistors MN3 and MN4. Transistor MN5 has a channel width of 2 microns and a channel length of 0.9 microns. Transistor MN6 has a channel width of 1 micron and a channel length of 0.6 microns. Preferably, the respective bulks of transistors MN3, MN4, and MN5 are coupled to $V_{NN}$.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A page buffer which selectively facilitates programming of an associated memory cell by controlling voltage of a bit line associated with said memory cell, said page buffer comprising:

an input terminal coupled to receive a data signal;

an output terminal coupled to said bit line;

a pass transistor connected between said output terminal and a negative voltage supply providing a negative voltage; and a data latch having a first control terminal coupled to receive said data signal, a second control terminal coupled to receive a complement of said data signal, and a first node coupled to a gate of said pass transistor, wherein said pass transistor selectively pulls said bit line to said negative voltage to facilitate programming of said memory cell in response to said data signal being in a first logic state or allows said bit line to assume a floating potential to preclude programming of said memory cell in response to said data signal being in a second logic state.

2. The page buffer of claim 1, wherein said data latch comprises a cross-coupled latch.

3. The page buffer of claim 2, wherein said data latch further comprises:

a first transistor having a first current handling terminal connected to said negative voltage supply, a second current handling terminal connected to said first node, and a gate connected to a second node;

a second transistor having a first current handling terminal connected to said negative voltage supply, a second current handling terminal connected to said second node, and a gate connected to said first node;

a third transistor having a first current handling terminal connected to a voltage supply, a second current handling terminal connected to said second node, and a gate coupled to receive said data signal;

a fourth transistor having a first current handling terminal connected to said voltage supply, a second current handling terminal connected to said first node, and a gate coupled to receive said complement of said data signal.

4. The page buffer of claim 3, wherein bulks of said first and second transistors are connected to said negative voltage supply.

5. The page buffer of claim 3, wherein said first and second transistors comprise NMOS devices and said third and fourth transistors comprise PMOS transistors.

6. The page buffer of claim 3, wherein said third and fourth transistors have a larger current carrying capacity than said first and second transistors.

7. The page buffer of claim 1, further comprising an SRAM latch having a first node coupled to said first control terminal of said data latch and having a second node coupled to said second control terminal of said data latch.

8. The page buffer of claim 7, wherein said SRAM latch further comprises:

a first CMOS inverter having an input terminal coupled to said first control terminal of said SRAM latch and an output terminal coupled to said second control terminal of said SRAM latch; and a second CMOS inverter having an input terminal coupled to said second control terminal of said SRAM latch and an output terminal coupled to said first control terminal of said SRAM latch.

9. The page buffer of claim 8, wherein said first CMOS inverter comprises a first PMOS transistor and a first NMOS transistor connected between said supply voltage and ground potential, each having a gate coupled to said first node of said SRAM latch, and wherein said second CMOS inverter comprises a second PMOS transistor and a second NMOS transistor connected between said supply voltage and ground potential, each having a gate coupled to said second node of said SRAM latch.

10. The page buffer of claim 9, wherein said first PMOS transistor and said NMOS transistor have larger current carrying capacity than said second PMOS transistor and said second NMOS transistor.

\* \* \* \* \*